United States Patent
Loeliger et al.

(10) Patent No.: US 9,374,102 B1
(45) Date of Patent: Jun. 21, 2016

(54) DYNAMIC ANALOG TO DIGITAL CONVERTER (ADC) TRIGGERING

(71) Applicant: FREESCALE SEMICONDUCTOR, INC., Austin, TX (US)

(72) Inventors: Jeffrey T. Loeliger, Glasgow (GB); Mark J. Stachew, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/966,643

(22) Filed: Dec. 11, 2015

(51) Int. Cl.
*H03M 1/06* (2006.01)
*H03M 1/12* (2006.01)

(52) U.S. Cl.
CPC .......... *H03M 1/0604* (2013.01); *H03M 1/1225* (2013.01); *H03M 1/1245* (2013.01)

(58) Field of Classification Search
CPC ............ H03M 1/0604; H03M 1/1225; H03M 1/1245; H03M 1/1033; H03M 1/1095; H03M 1/109; H03M 1/183; H03M 1/162; H03M 1/123; H03M 1/0626
USPC .................................. 341/118–155; 370/259
See application file for complete search history.

(56) References Cited

U.S. PATENT DOCUMENTS

| | | | |
|---|---|---|---|
| 4,799,165 A | 1/1989 | Hollister et al. | |
| 4,914,566 A | 4/1990 | Steutermann | |
| 5,233,573 A | 8/1993 | Bettelheim et al. | |
| 5,736,948 A * | 4/1998 | Mitsuishi | H03K 17/693 341/141 |
| 6,745,107 B1 | 6/2004 | Miller | |
| 6,795,010 B1 * | 9/2004 | Potlapalli | G06F 3/05 341/141 |
| 6,798,371 B1 * | 9/2004 | Potlapalli | H03M 1/1225 341/155 |
| 7,042,382 B1 * | 5/2006 | Paterno | H03M 1/0624 341/131 |
| 7,071,862 B1 * | 7/2006 | Scarpulla | H03M 1/162 341/155 |
| 7,126,515 B1 * | 10/2006 | Kris | H03M 1/1215 341/141 |
| 7,589,656 B2 * | 9/2009 | Aspelmayr | F02D 41/263 341/155 |
| 7,808,419 B2 | 10/2010 | Chen et al. | |
| 7,948,409 B2 * | 5/2011 | Wu | G11B 7/1263 341/110 |
| 8,073,085 B1 | 12/2011 | Vaidyanathan et al. | |
| 8,244,381 B2 | 8/2012 | Marshall et al. | |
| 8,392,740 B2 * | 3/2013 | Dewhirst | G06F 1/12 341/126 |
| 8,446,996 B1 | 5/2013 | Viadyanathan et al. | |
| 2004/0109273 A1 | 6/2004 | Honda et al. | |

FOREIGN PATENT DOCUMENTS

EP 1111222 A2 6/2001
EP 158725 A1 10/2005

OTHER PUBLICATIONS

"PIC18F8722 Family Data Sheet" Online 2004, Microchip Technology Inc. XP002487890, Retrieved from the Internet: URL: http://www.microchip.com/downloads/en/DeviceDoc/39646b.pdf> (Retrieved on Jul. 11, 2008) pp. 11-30, 161-205, 271-289.

* cited by examiner

*Primary Examiner* — Lam T Mai

(57) ABSTRACT

A method and apparatus are configured to receive at a control input of an analog to digital converter (ADC) circuit, from a control output of a control circuit, a first instance of control information that indicates a conversion characteristic of the ADC, wherein the conversion characteristic is one of a first conversion rate and a first conversion resolution, to provide at a status output of the ADC status information regarding the conversion of a first analog signal by the ADC circuit, to receive at the control input of the ADC a second instance of the control information that adjusts the conversion characteristic to allocate a first portion of an ADC circuit bandwidth of the ADC circuit to continuing receiving the first analog signal and to allocate a second portion of the ADC circuit bandwidth to receiving a second analog signal.

20 Claims, 4 Drawing Sheets

DYNAMIC ANALOG TO DIGITAL CONVERTER (ADC) TRIGGERING

BACKGROUND

1. Field of the Disclosure

The present disclosure relates generally to control systems and more specifically to analog to digital converters (ADCs).

2. Background of the Disclosure

Many parameters are obtained or communicated in the form of analog signals. Examples of such parameters include a voltage level, a current level, a power level, a temperature, a speed, a rotational velocity, and a position, such as a linear position or an angular position. Such parameters are often processed by digital circuitry. Since digital circuitry processes digital values, as opposed to analog signals, an analog to digital converter (ADC) is typically used to convert an analog signal to a digital value representative of the amplitude of the analog signal.

Under some circumstances, such as when continuous sampling of a signal is not needed, an ADC can be used to convert multiple analog signals to multiple digital values respectively representative of the multiple analog signals. However, other applications having various speed and resolution limitations often require that additional ADCs be used, for example, as time-interleaved ADCs, where one ADC operates during a time period that overlaps with a time period during which another ADC operates, to provide conversion of the multiple analog signals, which increases cost and complexity.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

As disclosed herein, the sample rate and resolution of an analog-to-digital converter (ADC) can be coherently varied. Coherence, in this context, means the sample rate or resolution of the ADC change to track the envelope of a waveform being sampled by the ADC. The method and apparatus dynamically change the allocated speed and resolution of ADC conversions in response to a trigger event and check the speed and resolution of ADC results in response to the trigger event. Signals between the ADC and the circuit to which it provides digital output data are used to define a conversion rate for the ADC while keeping the ADC trigger active so continuous conversions can occur. The changes in sample rate or resolution are not necessarily known before the ADC conversion is started and may be dependent on an external trigger (for example, an engine angle) or on the current waveform itself.

By simultaneously selectively apportioning resolution and sample speed of an ADC for conversion of multiple channels with feedback checking as disclosed herein, peak ADC bandwidth demands can be reduced, which can reduce the cost of implementing the ADC. This can reduce the number of ADC converters required, allow slower ADC to be used, or both. Moreover, safety can be increased by providing feedback status signals from the ADC to the circuit requesting the conversions.

Figure 1:
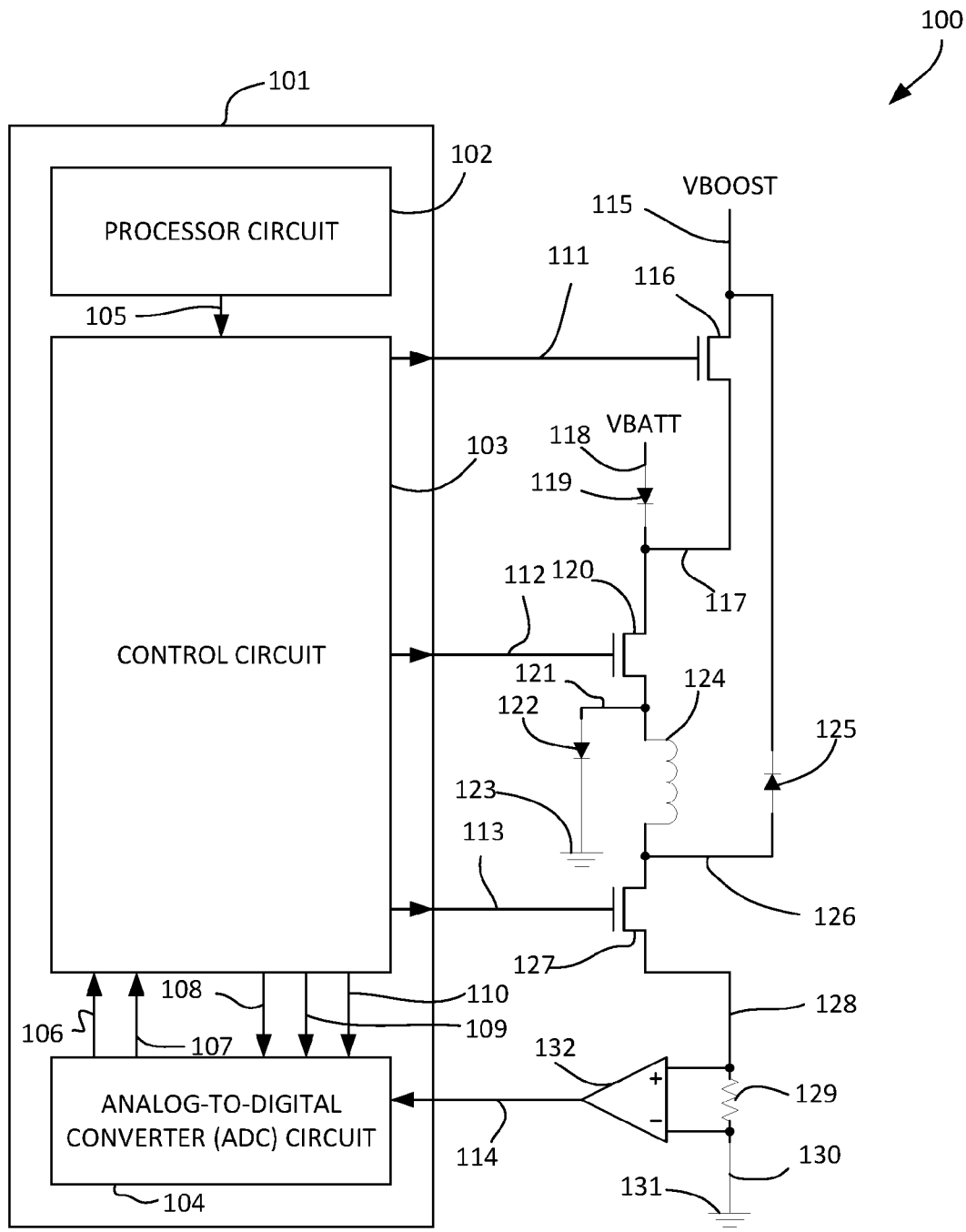
FIG. 1 is a schematic diagram illustrating a specific embodiment of a system for providing dynamic ADC triggering in accordance with an embodiment.

FIG. 1 is a schematic diagram illustrating a specific embodiment of system for providing dynamic ADC triggering in accordance with an embodiment. System 100 comprises control subsystem 101, transistor 116, diode 119, transistor 120, diode 122, load 124, diode 125, transistor 127, resistor 129, and amplifier 132. Control subsystem 101 comprises processor circuit 102, control circuit 103, and analog-to-digital (ADC) circuit 104.

Processor circuit 102 can be an enhanced time processor unit (eTPU) or other microprocessor or microcontroller circuit. Control circuit 103 can be a reaction module that controls a reaction such as the burning of fuel in air in an engine, for example, for controlling a vehicle fuel injector. ADC circuit 104 can be Nyquist ADC circuit.

During operation, processor circuit 102 provides a processor control output to processor control input 105 of control circuit 103. Control circuit 103 provides a trigger output for triggering conversion of an analog input signal by ADC circuit 104 to trigger input 108 of ADC circuit 104. Control circuit 103 provides a conversion rate output for requesting ADC circuit 104 to provide a requested conversion rate for conversion of an analog input signal by ADC circuit 104 to conversion rate input 109 of ADC circuit 104. Control circuit 103 provides a conversion resolution output for requesting ADC circuit 104 to provide a requested conversion resolution for conversion of an analog input signal by ADC circuit 104 to conversion resolution input 110 of ADC circuit 104. ADC circuit 104 provides a digital output 106 to convey a digital representation of an analog input signal to a digital input of control circuit 103 after performing the conversion. ADC circuit 104 provides a status output 107 to convey a status signal to a status input of control circuit 103. The status signal can reflect a status of the ability of ADC circuit 104 to perform requested conversions according to requested conversion rates and requested conversion resolutions. As an example, the status signal can indicate whether or not the sum of the portions of the ADC bandwidth required to satisfy the conversion requests according to the requested conversion rates and requested conversion resolutions exceeds the total ADC bandwidth available to perform conversions.

Control circuit 103 provides an output 111 to a gate terminal of transistor 116 to control conduction of transistor 116. A boost voltage VBOOST is provided at node 115. Node 115 is connected to first terminal of transistor 116 and to a cathode terminal of diode 125. A second terminal of transistor 116 is connected to node 117. A battery voltage VBATT is connected to node 118. Node 118 is connected to an anode terminal of diode 119. A cathode terminal of diode 119 is connected to node 117 and to a first terminal of transistor 120. Control circuit 103 provides an output to a gate terminal of transistor 120. A second terminal of transistor 120 is connected to node 121. Node 121 is connected to an anode terminal of diode 122 and to a first terminal of load 124. A cathode terminal of diode 122 is connected to ground voltage 123. A second terminal of load 124 is connected to node 126. Node 126 is connected to an anode terminal of diode 125 and to a first terminal of transistor 127. Control circuit 103 provides an output 113 to a gate terminal of transistor 127. A second terminal of transistor 127 is connected to node 128. Node 128 is connected to a first terminal of resistor 129 and to a non-inverting input of amplifier 132. An inverting input of amplifier 132 and a second terminal of resistor 129 are connected to ground voltage 131. An output of amplifier 132 is connected to an analog input 114 of ADC circuit 104.

As described above, an ADC trigger, such as at trigger input 108 of FIG. 1, can be issued subject to signals to specify the operation of the ADC rather than simply requesting the ADC to continuously convert a predefined channel without further refinement. As described herein, conversion control signals can be added to a trigger signal to accompany the trigger signal and to change the way the conversion is done. So, for example, a system can include paths to pass a trigger signal (e.g., trigger input 108) and a conversion rate signal (e.g., conversion rate input 109) between a requesting module, such as control circuit 103 (e.g., a reaction module), and ADC 104. When the trigger is high and the conversion rate signal is high, the channel is converted at a high rate. When the trigger is high and the conversion rate signal is low, the channel is converted at a low rate.

Figure 2:
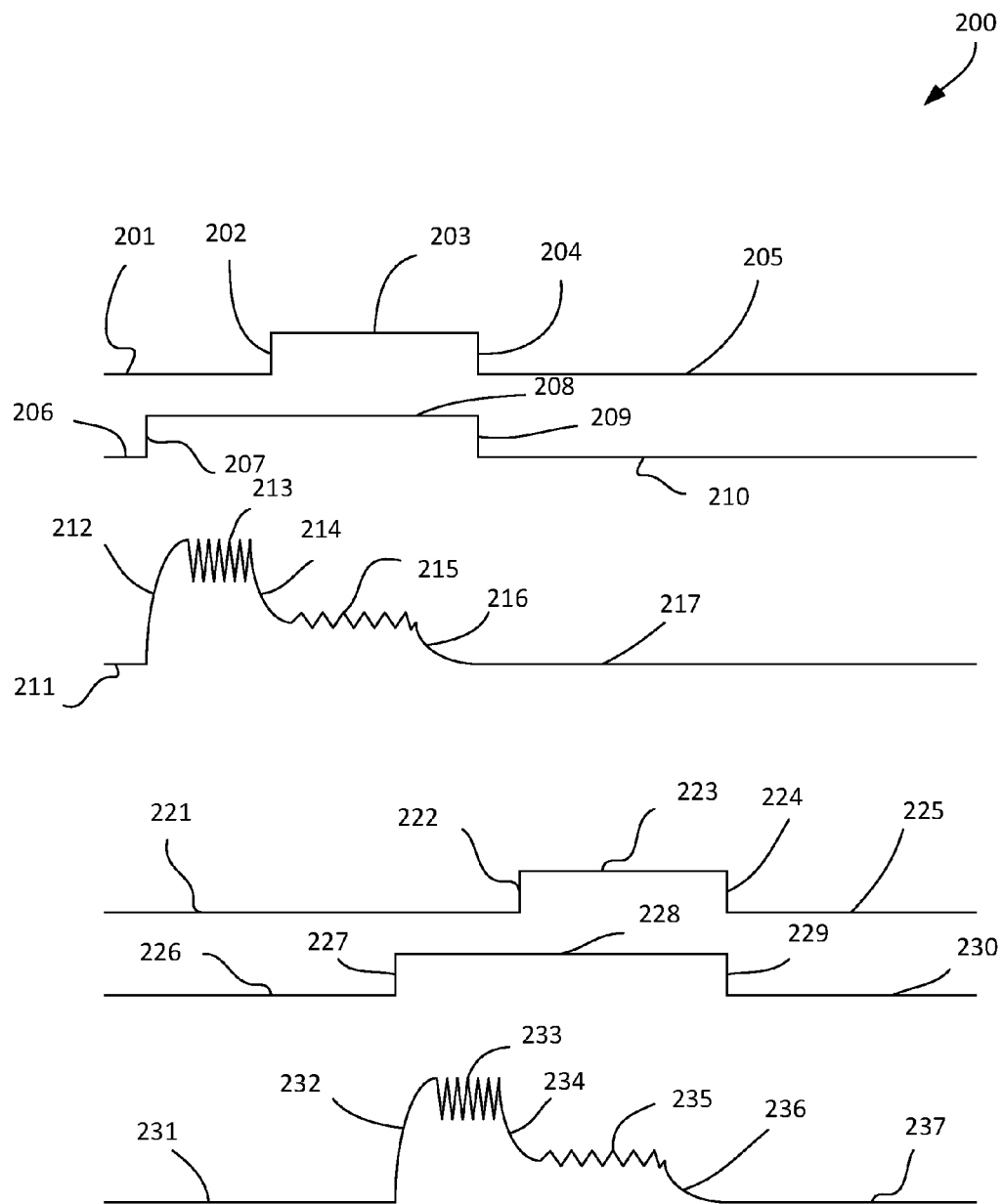
FIG. 2 is a timing diagram illustrating dynamic ADC triggering in accordance with an embodiment.

FIG. 2 is a timing diagram illustrating dynamic ADC triggering in accordance with an embodiment. Timing diagram 200 shows a first analog input signal 211 beginning at a baseline voltage, such as a ground voltage, and rising, at rising edge 212 to an initial active level region 213, then falling at falling edge 214 to a continued active level region 215, then falling at falling edge 216 to the baseline voltage 217. Timing diagram 200 shows a first input signal first trigger signal 206 beginning at a low logic level and rising at rising edge 207 to a high logic level for duration 208, then falling at falling edge 209 to a low logic level for duration 210. Rising edge 207 of first input signal first trigger signal 206 occurs temporally proximate to rising edge 212 of first analog input signal 211. Falling edge 209 of first input signal first trigger signal 206 occurs temporally proximate to falling edge 216 of first analog input signal 211. Timing diagram 200 shows a first input signal second trigger signal 201 beginning at a low logic level and rising at rising edge 202 to a high logic level for duration 203, then falling at falling edge 204 to a low logic level for duration 205. Rising edge 202 of first input signal second trigger signal 201 occurs temporally proximate to falling edge 214 of first analog input signal 211. Falling edge 204 of first input signal second trigger signal 201 occurs temporally proximate to falling edge 216 of first analog input signal 211.

Timing diagram 200 shows a second analog input signal 231 beginning at a baseline voltage, such as a ground voltage, and rising, at rising edge 232 to an initial active level region 233, then falling at falling edge 234 to a continued active level region 235, then falling at falling edge 236 to the baseline voltage 237. Timing diagram 200 shows a second input signal first trigger signal 226 beginning at a low logic level and rising at rising edge 227 to a high logic level for duration 228, then falling at falling edge 229 to a low logic level for duration 230. Rising edge 227 of second input signal first trigger signal 226 occurs temporally proximate to rising edge 232 of second analog input signal 231. Falling edge 229 of second input signal first trigger signal 226 occurs temporally proximate to falling edge 236 of second analog input signal 231. Timing diagram 200 shows a second input signal second trigger signal 221 beginning at a low logic level and rising at rising edge 222 to a high logic level for duration 223, then falling at falling edge 224 to a low logic level for duration 225. Rising edge 222 of second input signal second trigger signal 221 occurs temporally proximate to falling edge 234 of second analog input signal 231. Falling edge 224 of second input signal second trigger signal 221 occurs temporally proximate to falling edge 236 of second analog input signal 231.

In accordance with one embodiment, the method and apparatus may be applied to, for example, powertrain applications. As an example, an embodiment may be used in a closed loop feedback system for fuel injectors. One more particular example is a four-cylinder Diesel direct injection (DDI) engine application. DDI injectors require a peak and hold current waveform. During the peak part of the waveform a higher voltage is used. The time derivative of the current (di/dt) during the peak can be, for example, 10 times the time derivative of the current (di/dt) during the hold. First analog input signal 211 and second analog input signal 231 of FIG. 2 can represent waveforms suitable for use in a DDI engine application.

In particular boosted (e.g., high voltage) direct injection can be used for Diesel engines. In a "peak" phase, which occurs earlier during the injector actuation waveform, the injector can be powered at, for example, 60-80 volts at 20-25 amperes. The current in the injector should be controlled with a tolerance of, for example, about one ampere. These exemplary values drive a nominal requirement of about a one microsecond loop time for the control loop. When the injector is in the "hold" phase, as can be exemplified by continued active level regions 215 and 235 of FIG. 2, which is a later phase that follows the "peak" phase, which can be exemplified by initial active level regions 213 and 233 of FIG. 2, the battery voltage (e.g., ~12V) and between 5-8 amps are the power parameters for the injector. When in the "hold" phase with the lower voltage and current, the loop time can be slower and still meet the one ampere tolerance. Because of the differences in ADC parameter values that can provide conversion during the different phases of operation, a different loop time can be used to vary the ADC conversion rate, thereby freeing up addition ADC bandwidth for conversion of other signals.

The hardware implementation of FIG. 1 can provide fast response, which is useful in that the transition time from peak to hold phase may not be known when the ADC conversions starts. This transition depends on how the injector operates given the current engine conditions. A hardware implementation can also avoid any interruptions in the conversion results being delivered to the reaction module. If there were to be a disruption, then the tolerance on the close loop time could be exceeded.

The reaction module is designed to control high speed closed loop systems. It modulates output signals based on feedback signals converted by the ADC. In the direct injection use case, the reaction module controls the current in the fuel injector. The current in the fuel injector is controlled to conform to a current profile. It is normal to have a "peak" and "hold" phase. However, typically there are several other smaller phases in the output current waveform. In a system such as that illustrated in FIG. 1, the reaction module is configured to turn on the "boost" field effect transistor (FET), the "Batt" FET, and the low-side FET to start the "peak" phase. The reaction module then uses the ADC conversion results to maintain the current in the injector between, for example, 22-23 amperes. After a certain amount of time in the peak phase, the injector transitions to the hold phase. The "boost" FET is turned off, and the current is maintained at around, for example, 5-6 amperes. Since the rise time of the current in the injector is measured, the time it will take is not known before the start of the injection.

In fuel injection systems, it is possible that more than one injector is used at the same time. The first phase is the "peak" phase with the higher current and faster modulation, followed by the "hold" phase at lower current and slower modulation. Since the exact transition point between peak and hold phases is not known before the start of the conversions, an ADC without coherent triggering would run at the high rate during the complete waveform, resulting in inefficient use of the ADC's bandwidth. Without an ability to control the conversion rate and resolution, a trigger signal between the modules would simply signify that the ADC should start converting a pre-defined channel at a pre-defined conversion rate (e.g., speed) and send the results to the reaction module until the signal is deactivated. If each waveform requires one megasample per second (Msps) and the ADC conversion rate is more than one Msps but less than two Msps then two ADCs would required to convert the waveforms, thereby increasing the cost and complexity of the system.

However, by providing an ability to coherently trigger the ADC, with additional signals exchanged between a control circuit and the ADC, the additional signals allow the control circuit (e.g., reaction module) to vary the conversion rate dynamically based on the closed loop control needs. This allows accurate conversion during the "hold" phase while using reduced ADC bandwidth. From the control circuit to the ADC, a trigger signal and additional signals are communicated. The trigger signal requests that the ADC provide a continuous stream of conversions to be sent to the destination for the conversions (e.g., the control circuit). There are additional signals that provide information about the requested conversion rate. By exchanging signals to coordinate operation of the control circuit and the ADC circuit, a lower conversion rate can be used and still provide accurate conversion during a phase of the sampled waveform that does not require a higher conversion rate.

Figure 3:
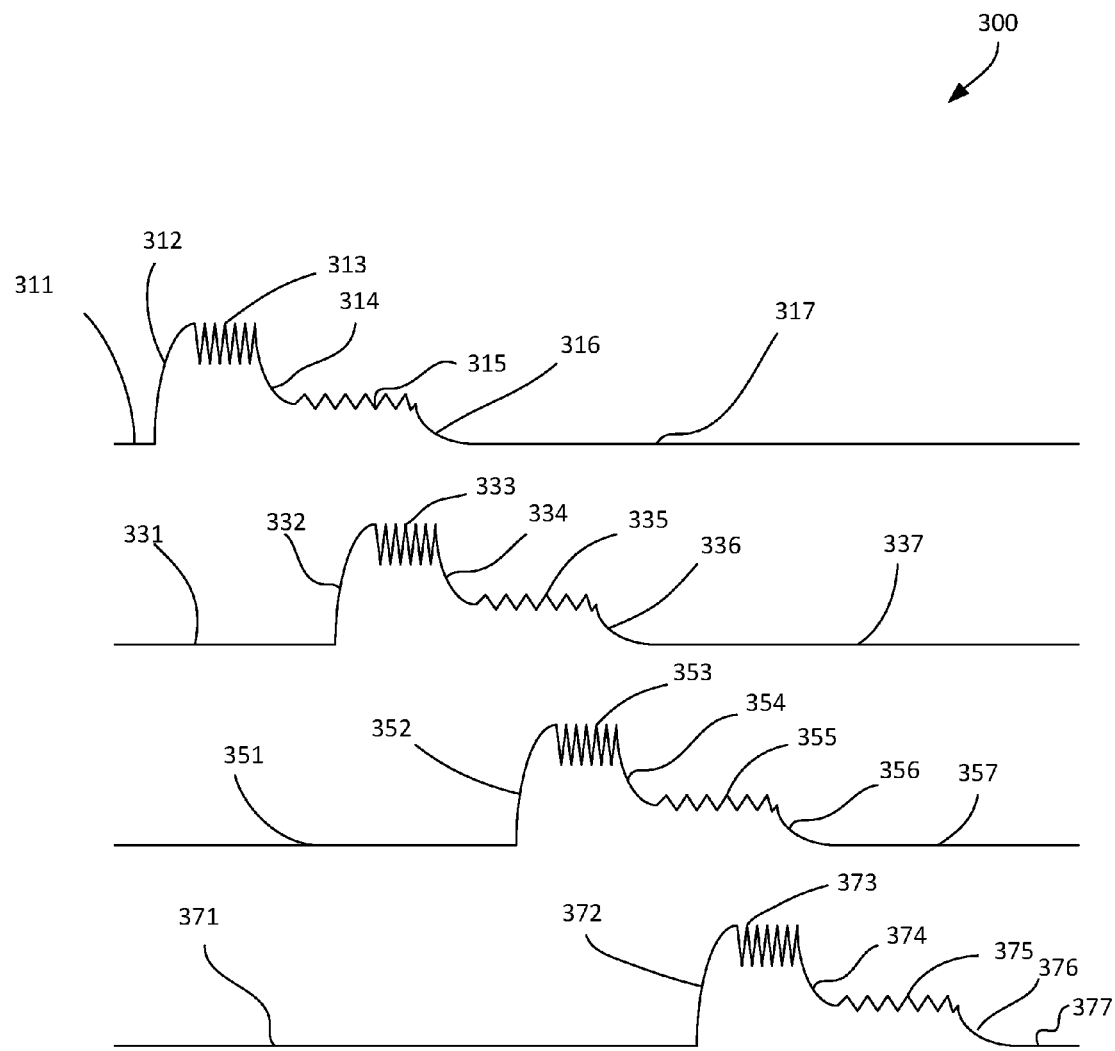
FIG. 3 is a timing diagram illustrating dynamic ADC triggering in accordance with an embodiment.

FIG. 3 is a timing diagram illustrating dynamic ADC triggering in accordance with an embodiment. Timing diagram 300 shows a first analog input signal 311 beginning at a baseline voltage, such as a ground voltage, and rising, at rising edge 312 to an initial active level region 313, then falling at falling edge 314 to a continued active level region 315, then falling at falling edge 316 to the baseline voltage 317. Timing diagram 300 shows a second analog input signal 331 beginning at a baseline voltage, such as a ground voltage, and rising, at rising edge 332 to an initial active level region 333, then falling at falling edge 334 to a continued active level region 335, then falling at falling edge 336 to the baseline voltage 337. Timing diagram 300 shows a third analog input signal 351 beginning at a baseline voltage, such as a ground voltage, and rising, at rising edge 352 to an initial active level region 353, then falling at falling edge 354 to a continued active level region 355, then falling at falling edge 356 to the baseline voltage 357. Timing diagram 300 shows a fourth analog input signal 371 beginning at a baseline voltage, such as a ground voltage, and rising, at rising edge 372 to an initial active level region 373, then falling at falling edge 374 to a continued active level region 375, then falling at falling edge 376 to the baseline voltage 377.

In addition to conversion rate, other information or other characteristics can also be communicated between the modules. As an example, a system may comprise a multi-channel reaction module and an ADC, as illustrated in FIG. 1. The ADC can have, for example, a bandwidth of 1.2M samples per second. The injectors' closed loop control can be satisfied, for example, at sampling rates of 1M sample per second in "peak" phase and 0.1M samples per second in the "hold" phase. Given this configuration the following waveforms can be converted by one ADC capable of at least 1.1 Msps even if the ADC is not capable of more than 2 Msps. Since the "peak" phases and a "hold" phases of different injectors are staggered in time, as shown in FIG. 3, the conversions for the different injectors can be inter-spaced on a single ADC, allocating more ADC bandwidth to an injector during its "peak" phase and less ADC bandwidth to an injector during its "hold" phase. In accordance with at least one embodiment, allocation of ADC bandwidth among different loads (e.g., injectors) may be implemented by using an additional signal to switch between ADC queues. The queues can be dynamically configured based on the requested rate of conversion results.

Figure 4:
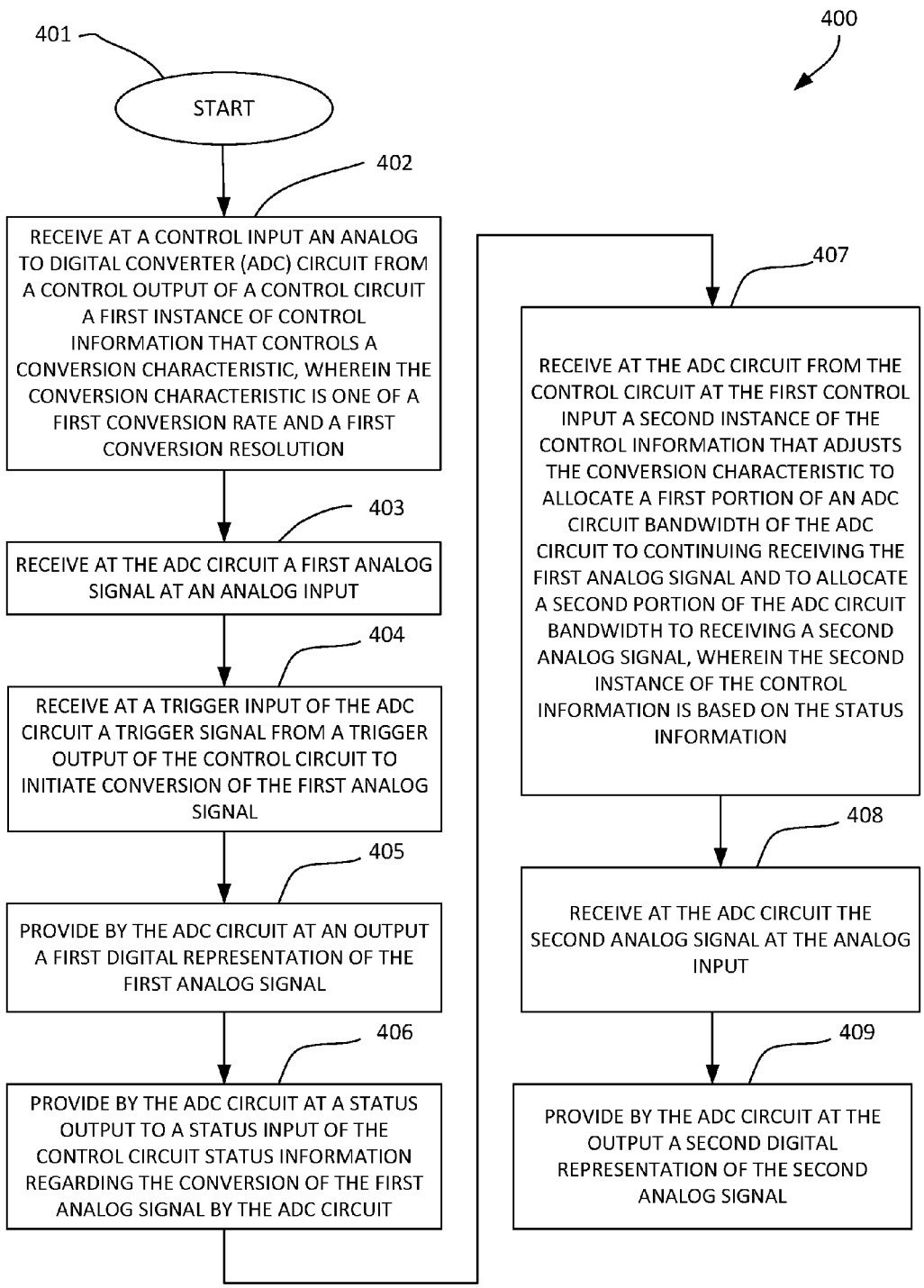
FIG. 4 is a flow diagram illustrating a method for dynamic ADC triggering in accordance with an embodiment.

FIG. 4 is a flow diagram illustrating a method for dynamic ADC triggering in accordance with an embodiment. Method 400 begins at block 401 and continues to block 402. At block 402, a first instance of control information that controls a conversion characteristic is received at a control input an analog to digital converter (ADC) circuit from a control output of a control circuit. The conversion characteristic is one of a first conversion rate and a first conversion resolution. From block 402, method 400 continues to block 403. At block 403, a first analog signal is received at the ADC circuit. From block 403, method 400 continues to block 404. At block 404, a trigger signal is received at a trigger input of the ADC circuit from a trigger output of the control circuit to initiate conversion of the first analog signal. From block 404, method 400 continues to block 405. At block 405, a first digital representation of the first analog signal is provided by the ADC circuit at an output. From block 405, method 400 continues to block 406. At block 406, a status input of the control circuit status information regarding the conversion of the first analog signal by the ADC circuit is provided by the ADC circuit at a status output. From block 406, method 400 continues to block 407. At block 407, a second instance of the control information is received at the ADC circuit from the control circuit at the first control input. The second instance of the control information adjusts the conversion characteristic to allocate a first portion of an ADC circuit bandwidth of the ADC circuit to continuing receiving the first analog signal and to allocate a second portion of the ADC circuit bandwidth to receiving a second analog signal. The second instance of the control information is based on the status information. From block 407, method 400 continues to block 408. At block 408, the second analog signal is received at the ADC circuit at the analog input. From block 408, method 400 continues to block 409. At block 409, a second digital representation of the second analog signal is provided by the ADC circuit at the output.

As shown in the FIGs. and described above, ADC bandwidth can be utilized more efficiently according to a system to coherently vary the ADC sample rate and resolution. For ADCs that can switch quickly between input channels, for example, where a single ADC can do conversions on two or more channels back to back (e.g., a fast Nyquist ADC), additional signals between a control circuit and the ADC circuit are provided to request a sample rate for the ADC to use while keeping the ADC trigger active so continuous conversions happen. This is achieved by dynamically varying the sample rate and resolution of the ADC conversions. Dynamic varying of the sample rate and resolution of the ADC conversions means that at least one of the sample rate and resolution of the ADC conversions is changed while a continuous stream of conversions is being performed. The changes in number of bits or rate that results are needed is not necessarily known before the ADC conversions are started and may be dependent on an external trigger, such as a timing input signal having a period related to a waveform period of repetitive waveform of an analog input signal provided to the ADC circuit (for example, an engine angle, which is periodic and related to a repetitive waveform of a fuel injector signal), or the current waveform itself, as can occur in block 404 of FIG. 4. As examples, the engine angle may be a camshaft angle, a crankshaft angle, or the like. By monitoring and checking the requested sample rate and resolution, the control circuit can be provided with information for efficiently utilizing the ADC circuit. For example, requested sample rates and resolutions can be determined based on actual performance of the ADC circuit as reported by the monitoring and checking, which can occur, for example, via conversion rate input 109, conversion resolution input 110, and status output 107 of FIG. 1.

By coherently varying the ADC sample rate as described in the method of FIG. 4, a regular steady flow of conversion results are sent to the module receiving the conversion results, such as a reaction module. A hardware implementation can assure the steady flow of results without possible indeterminism and latency of a central processing unit (CPU), interrupt servicing, and a memory system of a microcontroller that could complicate dynamic adjustments for control systems with fast update rates.

At least one embodiment can provide improved feedback and safety. For example, the ADC may not be limited to being used exclusively for the closed loop feedback task. Rather, it may be flexibly employed to provide virtual or shared ADCs. In order to allow flexibility in the scheduling of the conversions, it may not be possible to sample at the requested speed or resolution given the finite bandwidth of the ADC. By dynamically scheduling ADC conversions, there is a possibility that more conversion bandwidth could be requested than is available. When more bandwidth is requested of the ADC than the ADC is able to provide, the ADC can send a status signal back to the requesting module indicating the inability of the ADC to fulfill the requests. The requesting module, upon receiving the status signal, can change its requests to avoid exceeding the available ADC bandwidth. By providing status information from the ADC to the requesting module requesting the conversion and receiving digital output data from the ADC, the status information gives the requesting module the opportunity to decide if the requested conversions should cause an error or just be monitored.

The requesting module (e.g., the control circuit) can be configured to select the best way to handle not getting enough bandwidth for its desired requests. In the direct injection use case, one solution is to ignore the problem as long as it only lasts for a short while. When enough bandwidth is not allocated and sampling of the injector current is not fast enough, the modulation gets wider (e.g., higher highs and lower lows). The higher high level can cause additional heat in the injector. The increased heat may be acceptable for a short amount of time but may cause an error if the condition persists. If not enough bandwidth is available consistently, then the operation of the injector may need to be stopped.

One reason for requests for too much bandwidth may be because of an error condition in the circuit. So, for example, if the injector does not meet the high peak level, the resulting waveform might indicate selection of the higher conversion rate for a longer time, which would increase the demand for bandwidth from the ADC.

One way for the ADC to handle the request for more bandwidth than is available is by modifying the requests itself. For example, the ADC could give all requests a lower bandwidth, reduce the bandwidth on the oldest request, or give the newest request full bandwidth, ignoring either the oldest or newest request. Regardless of the particular action taken, the ADC can signal the module or requesting channel that the requested bandwidth is not being delivered.

As an ADC need not be used exclusively for closed loop control, feedback signals provide a mechanism to ensure a control circuit is getting the ADC bandwidth it needs. As another possibility, the control circuit can communicate with a main central processing unit (CPU) to remove or limit other conversions requested of the ADC. The feedback signals can also ease implementation of virtual ADCs.

An ADC system providing coherent triggering can support multiple conversion rates during a single triggering event, even as conversions are occurring continuously. In the direct injection use case, two conversion rates may be utilized, with one high speed conversion rate being used during the peak phase and one lower speed conversion rate being used during the hold phase. However, there may be implementations using more than two speed or conversion rates. Multiple configurations not limited to a particular number of conversion rates but selectable or adaptable between different numbers of conversion rates are possible. Additional signals between the requesting module and the ADC can be used to select or provide notification of the configuration being used.

Additional signals between a requesting module (e.g., control circuit) and an ADC may be used to control other characteristics besides conversion rate and resolution. As an example, an additional signal may be used to control a power level. For example, an additional signal may indicate a lower power mode. Among other attributes, the lower power mode may involve reducing the sample rate or clocking of the module.

While examples have been described with respect to closed loop fuel injector current control, other types of closed loop control can be implemented where an attribute whose change can be unknown a priori (e.g., before we started converting the waveform) may change during continuous conversions, and a characteristic of the ADC can be altered, which can change how the ADC converts the waveform.

In the exemplary direct injection use case described above, the closed loop control of the injector from peak phase to hold phase is an event that causes the transition in the ADC conversions. Other events could also cause a transition in a characteristic of the ADC. The exact timing at which the event will occur need not be known before the ADC conversions start, and the ADC conversions can occur continuously, including before, during, and after the occurrence of the event and before, during, and after the ADC's change of the characteristic in response to the occurrence of the event. One example of such a possible event is an angle position in an engine. The exact timing of an engine angle may not be known until it happens. The angle position or other occurrence of another event could be used as an event to change the ADC conversion configuration.

In accordance with at least one embodiment, rather than having multiple ADC converters on a device there may be one (or two for safety) very fast ADCs configured as virtual ADCs to function like several slower ADCs. Each of the virtual ADCs can be provided with its own fixed queue. Logic is provided to schedule the conversions on the fast ADC so that all of the virtual ADC channels get converted at the correct time. The additional signals described herein can provide more information for the scheduling the conversions using virtual ADCs. Scheduling the operation of virtual ADCs can be complicated, so the feature of providing feedback to the requesting module about the rate of ADC conversions it is receiving can be very useful for virtual ADCs. As an example, for a system with two peak and hold signals to measure, a trigger signal and a signal to define how fast results are needed may be implemented. So, to provide those two control signals for each of the two signaled to be measured, four signals can be provided to the ADC circuit, including two trigger signals for the event triggers and two conversion rate signals for the result rates. To implement such a system using fixed queues, 16 (i.e., 2^4) queues can be implemented for all of the possible conditions. The ADC can then switch between the queues to provide the equivalent to defining the conversions dynamically. In a practical implementation, some of the conditions, such as no triggers being active, would not need a queue, and there may be some other external limitation that may avoid the need all of the $2^n$ queues. For cases with larger numbers of queues, the additional signals described herein can be used instead of the multiple queues to avoid the need for large numbers of queues.

In the foregoing description, the term "at least one of" is used to indicate one or more of a list of elements exists, and, where a single element is listed, the absence of the term "at least one of" does not indicate that it is the "only" such element, unless explicitly stated by inclusion of the word "only" or a similar qualifier.

In accordance with at least one embodiment, an apparatus comprises an analog to digital converter (ADC) circuit and a control circuit. The ADC circuit comprises an analog input to receive a first analog signal, a trigger input to receive a trigger signal to initiate conversion of the first analog signal, a first control input to receive control information to control a conversion characteristic, an output to provide a digital representation of the first analog signal, and a status output to provide a status signal representative of a status of the ADC circuit subject to the conversion characteristic. The control circuit comprises a first input, a first output coupled to the trigger input of the ADC circuit to provide the trigger signal to initiate conversion of the first analog signal, and a control output coupled to the first control input of the ADC circuit to provide the control information to the ADC circuit, wherein the control circuit determines the control information in response to and as a function of input information received at the first input, wherein the input information received at the first input is at least one of an timing input signal and a change of a parameter value of the first analog signal, and the conversion characteristic is one of a first conversion rate and a first conversion resolution.

In accordance with at least one embodiment, the control circuit is configured to adjust the one of the first conversion rate and the first conversion resolution while an ADC trigger signal remains active. In accordance with at least one embodiment, the ADC circuit performs continuous conversions while the ADC trigger signal remains active. In accordance with at least one embodiment, the timing input signal indicates a shaft angle. In accordance with at least one embodiment, the shaft angle is an engine shaft angle. In accordance with at least one embodiment, the conversion characteristic comprises both the first conversion rate and the first conversion resolution. In accordance with at least one embodiment, the ADC circuit is configured to receive a second analog signal at the analog input, wherein the control circuit is configured to provide a second output coupled to the first control input to provide control information to the ADC circuit that indicates a second conversion characteristic, wherein the conversion characteristic pertains to the first conversion rate and the second conversion characteristic pertains to the first conversion resolution.

In accordance with at least one embodiment, a method comprises receiving at a control input of an analog to digital converter (ADC) circuit, from a control output of a control circuit, a first instance of control information indicating a conversion characteristic of the ADC, wherein the conversion characteristic is one of a first conversion rate and a first conversion resolution. The method further comprises receiving at a first analog signal at an analog input of the ADC circuit. The method further comprises receiving at a trigger input of the ADC circuit a trigger signal to initiate conversion of the first analog signal. The method further comprises providing at an output of the ADC a first digital representation of the first analog signal. The method further comprises providing at a status output of the ADC status information regarding the conversion of the first analog signal by the ADC circuit. The method further comprises receiving the information regarding the conversion at a status input of the control circuit. The method further comprises receiving at the control input of the ADC a second instance of the control information from the control circuit that adjusts the conversion characteristic to allocate a first portion of an ADC circuit bandwidth of the ADC circuit to continuing receiving the first analog signal and to allocate a second portion of the ADC circuit bandwidth to receiving a second analog signal, wherein the second instance of the control information is responsive to the status information. The method further comprises receiving at the ADC circuit the second analog signal at the analog input. The method further comprises providing by the ADC circuit at the output a second digital representation of the second analog signal.

In accordance with at least one embodiment, the receiving at the ADC circuit from the control circuit at the control input a second instance of the control information to adjusts the conversion characteristic occurs while the trigger signal remains active. In accordance with at least one embodiment, the ADC circuit performs continuous conversions while the trigger signal remains active. In accordance with at least one embodiment, the second instance of the control information is based on a shaft angle. In accordance with at least one embodiment, the shaft angle is an engine shaft angle. In accordance with at least one embodiment, the conversion characteristic comprises both the first conversion rate and the first conversion resolution. In accordance with at least one embodiment, the ADC circuit is configured to provide the status information based on a sum of the first portion of an ADC circuit bandwidth and the second portion of the ADC circuit bandwidth relative to a total ADC circuit bandwidth.

In accordance with at least one embodiment, a system comprises an analog to digital converter (ADC) circuit and a control circuit. The ADC circuit comprises an analog input to receive a first analog signal, a control input to receive control information to control a conversion characteristic, an output to provide a digital representation of the first analog signal, and a status output to provide a status signal indicative of compliance with the conversion characteristic. The control circuit comprises a first input, a first output to initiate conversion of the first analog signal, and a control output coupled to the control input to provide the control information to the ADC, wherein the control circuit determines the control information in response to input information received at the first input, wherein the input information received at the first input is at least one of a timing input signal and a change of a parameter value of the first analog signal, and the conversion characteristic is one of a first conversion rate and a first conversion resolution.

In accordance with at least one embodiment, the control circuit is configured to adjust the one of the first conversion rate and the first conversion resolution while an ADC trigger signal remains active. In accordance with at least one embodiment, the ADC circuit performs continuous conversions while the ADC trigger signal remains active. In accordance with at least one embodiment, the conversion characteristic comprises both the first conversion rate and the first conversion resolution. In accordance with at least one embodiment, the ADC circuit is configured to receive a second analog signal at the analog input, wherein the control circuit is configured to provide a second output coupled to the control input to provide the control information to the ADC circuit to control the conversion characteristic. In accordance with at least one embodiment, the control circuit determines the control information that controls the conversion characteristic based on a change in a waveform represented by the digital representation of the first analog signal.

The concepts of the present disclosure have been described above with reference to specific embodiments. However, one of ordinary skill in the art will appreciate that various modifications and changes can be made without departing from the scope of the present disclosure as set forth in the claims below. In particular, the particular types of additional signals provided between an ADC circuit and a control circuit may be varied according to different embodiments. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An apparatus comprising:
an analog to digital converter (ADC) circuit comprising an analog input to receive a first analog signal, a trigger input to receive a trigger signal to initiate conversion of the first analog signal, a first control input to receive control information to control a conversion characteristic, an output to provide a digital representation of the first analog signal, and a status output to provide a status signal representative of a status of the ADC circuit subject to the conversion characteristic; and
a control circuit comprising a first input, a first output coupled to the trigger input of the ADC circuit to provide the trigger signal to initiate conversion of the first analog signal, and a control output coupled to the first control input of the ADC circuit to provide the control information to the ADC circuit, wherein the control circuit determines the control information in response to input information received at the first input, wherein the input information received at the first input is at least one of an timing input signal and a change of a parameter value of the first analog signal, and the conversion characteristic is one of a first conversion rate and a first conversion resolution.

2. The apparatus of claim 1 wherein the control circuit is configured to adjust the one of the first conversion rate and the first conversion resolution while an ADC trigger signal remains active.

3. The apparatus of claim 2 wherein the ADC circuit performs continuous conversions while the ADC trigger signal remains active.

4. The apparatus of claim 1 wherein the timing input signal indicates a shaft angle.

5. The apparatus of claim 4 wherein the shaft angle is an engine shaft angle.

6. The apparatus of claim 1 wherein the conversion characteristic comprises both the first conversion rate and the first conversion resolution.

7. The apparatus of claim 1 wherein the ADC circuit is configured to receive a second analog signal at the analog input, wherein the control circuit is configured to provide a second output coupled to the first control input to provide control information to the ADC circuit that indicates a second conversion characteristic, wherein the conversion characteristic pertains to the first conversion rate and the second conversion characteristic pertains to the first conversion resolution.

8. A method comprising:
receiving at a control input of an analog to digital converter (ADC) circuit, from a control output of a control circuit, a first instance of control information indicating a conversion characteristic of the ADC, wherein the conversion characteristic is one of a first conversion rate and a first conversion resolution;
receiving at a first analog signal at an analog input of the ADC circuit;
receiving at a trigger input of the ADC circuit a trigger signal to initiate conversion of the first analog signal;
providing at an output of the ADC a first digital representation of the first analog signal;
providing at a status output of the ADC status information regarding the conversion of the first analog signal by the ADC circuit;
receiving the information regarding the conversion at a status input of the control circuit;
receiving at the control input of the ADC a second instance of the control information from the control circuit that adjusts the conversion characteristic to allocate a first portion of an ADC circuit bandwidth of the ADC circuit to continuing receiving the first analog signal and to allocate a second portion of the ADC circuit bandwidth to receiving a second analog signal, wherein the second instance of the control information is responsive to the status information;
receiving at the ADC circuit the second analog signal at the analog input; and
providing by the ADC circuit at the output a second digital representation of the second analog signal.

9. The method of claim 8 wherein the receiving at the ADC circuit from the control circuit at the control input a second instance of the control information to adjust the conversion characteristic occurs while the trigger signal remains active.

10. The method of claim 9 wherein the ADC circuit performs continuous conversions while the trigger signal remains active.

11. The method of claim 8 wherein the second instance of the control information is based on a shaft angle.

12. The method of claim 11 wherein the shaft angle is an engine shaft angle.

13. The method of claim 8 wherein the conversion characteristic comprises both the first conversion rate and the first conversion resolution.

14. The method of claim 8 wherein the ADC circuit is configured to provide the status information based on a sum of the first portion of an ADC circuit bandwidth and the second portion of the ADC circuit bandwidth relative to a total ADC circuit bandwidth.

15. A system comprising:
an analog to digital converter (ADC) circuit comprising an analog input to receive a first analog signal, a control input to receive control information to control a conversion characteristic, an output to provide a digital representation of the first analog signal, and a status output to provide a status signal indicative of compliance with the conversion characteristic; and
a control circuit comprising a first input, a first output to initiate conversion of the first analog signal, and a control output coupled to the control input to provide the control information to the ADC, wherein the control circuit determines the control information in response to input information received at the first input, wherein the input information received at the first input is at least one of a timing input signal and a change of a parameter value of the first analog signal, and the conversion characteristic is one of a first conversion rate and a first conversion resolution.

16. The system of claim 15 wherein the control circuit is configured to adjust the one of the first conversion rate and the first conversion resolution while an ADC trigger signal remains active.

17. The system of claim 16 wherein the ADC circuit performs continuous conversions while the ADC trigger signal remains active.

18. The system of claim 15 wherein the conversion characteristic comprises both the first conversion rate and the first conversion resolution.

19. The system of claim 15 wherein the ADC circuit is configured to receive a second analog signal at the analog input, wherein the control circuit is configured to provide a second output coupled to the control input to provide the control information to the ADC circuit to control the conversion characteristic.

20. The system of claim 15 wherein the control circuit determines the control information that controls the conversion characteristic based on a change in a waveform represented by the digital representation of the first analog signal.

* * * * *